United States Patent
Kamata (10) Patent No.: US 8,686,415 B2
(45) Date of Patent: Apr. 1, 2014

(54) SEMICONDUCTOR DEVICE

(75) Inventor: Koichiro Kamata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/316,612

(22) Filed: Dec. 12, 2011

(65) Prior Publication Data
US 2012/0153276 A1 Jun. 21, 2012

(30) Foreign Application Priority Data

Dec. 17, 2010 (JP) ................................ 2010-281631

(51) Int. Cl.
*H01L 29/10* (2006.01)

(52) U.S. Cl.
USPC ...... 257/43; 257/296; 257/E29.068; 365/145; 365/148; 365/149

(58) Field of Classification Search
USPC ............. 257/43, 296, E29.068; 365/144–149
See application file for complete search history.

(56) References Cited

U.S. PATENT DOCUMENTS

| | | | |
|---|---|---|---|
| 4,466,081 A | | 8/1984 | Masuoka |
| 5,357,468 A | * | 10/1994 | Satani et al. ............ 365/189.07 |
| 5,615,145 A | * | 3/1997 | Takeuchi et al. ............... 365/145 |
| 5,627,782 A | * | 5/1997 | Tanaka et al. ............ 365/185.22 |
| 5,694,354 A | * | 12/1997 | Anami et al. ................. 365/154 |
| 5,706,241 A | * | 1/1998 | Nakamura et al. ............ 365/226 |
| 5,719,811 A | * | 2/1998 | Kondou .................... 365/189.06 |
| 5,742,551 A | * | 4/1998 | Yukutake et al. ............. 365/207 |
| 5,818,791 A | * | 10/1998 | Tanaka et al. ............ 365/230.06 |
| 6,026,034 A | * | 2/2000 | Suzuki et al. .................. 365/190 |
| 6,127,702 A | | 10/2000 | Yamazaki et al. |
| 6,804,142 B2 | | 10/2004 | Forbes |
| 2001/0002800 A1 | * | 6/2001 | Imamiya ........................ 327/310 |
| 2006/0102910 A1 | | 5/2006 | Yamazaki et al. |
| 2006/0221666 A1 | * | 10/2006 | Kang et al. ..................... 365/149 |

(Continued)

FOREIGN PATENT DOCUMENTS

| | | |
|---|---|---|
| EP | 0053878 A2 | 6/1982 |
| JP | 57-105889 A | 7/1982 |
| JP | 11-025682 A | 1/1999 |

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(Continued)

*Primary Examiner* — Alexander Sofocleous
*Assistant Examiner* — Ankush Singal
(74) *Attorney, Agent, or Firm* — Fish & Richardson P.C.

(57) ABSTRACT

An object is to provide a semiconductor memory device capable of shortening writing operation by concurrently determining potentials of memory cells on one word line. A plurality of transistors having switching characteristics are connected to one potential control circuit, whereby writing potentials are determined concurrently. A potential continues to be changed (raised or decreased) stepwise, a desired potential is determined while changing the potential, and whether data resulted from reading with respect to written data is correct or not is continuously checked, so that high-precision writing operation and high-precision reading operation can be achieved. In addition, favorable switching characteristics and holding characteristics of a transistor including an oxide semiconductor are utilized.

10 Claims, 6 Drawing Sheets

(56) References Cited

U.S. PATENT DOCUMENTS

| | | |
|---|---|---|
| 2007/0008766 A1* | 1/2007 | Yoshioka ................... 365/145 |
| 2007/0076510 A1* | 4/2007 | Mangan et al. .......... 365/230.03 |
| 2010/0027362 A1* | 2/2010 | Kang et al. ................. 365/203 |
| 2010/0148171 A1 | 6/2010 | Hayashi et al. |
| 2011/0058403 A1* | 3/2011 | Hashimoto et al. ........... 365/145 |
| 2011/0101351 A1 | 5/2011 | Yamazaki |
| 2011/0121878 A1 | 5/2011 | Kato et al. |
| 2011/0122673 A1 | 5/2011 | Kamata et al. |
| 2011/0128777 A1 | 6/2011 | Yamazaki et al. |
| 2011/0286256 A1* | 11/2011 | Kamata ....................... 365/72 |
| 2011/0317500 A1 | 12/2011 | Uochi et al. |
| 2012/0063204 A1* | 3/2012 | Kamata ....................... 365/149 |
| 2012/0063244 A1* | 3/2012 | Kwon et al. ............ 365/189.07 |

OTHER PUBLICATIONS

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

* cited by examiner

SEMICONDUCTOR DEVICE

BACKGROUND OF THE INVENTION

1. Field of the Invention

The invention disclosed herein relates to a semiconductor memory device using a semiconductor element and a method for driving the semiconductor memory device.

2. Description of the Related Art

At present, a dominating non-volatile ROM is a batch-erasing-type memory referred to as a flash memory. A flash memory is largely divided into a NOR type flash memory and a NAND type flash memory. A NOR type flash memory is used for firmware, a BIOS, and program code storage of an electronic appliance such as a mobile phone. A NAND type flash memory is used for a large capacity memory and an SD card.

Although a NOR type memory device has high reliability, an increase in speed at the time of writing, an improvement in power consumption, an improvement in integration degree, and the like are issues of a NOR type memory device. Although a NAND type memory device can have a high integration degree and large capacity, and a writing speed of the NAND type memory device is faster than that of a NOR type memory device, an improvement in reliability, a development in a function for correcting an error, and the like are issues of the NAND type memory device.

A flash memory includes a storage MOS transistor which includes a minute floating gate surrounded by an insulating film, a wiring for data input/output, and the like, and charge is accumulated in the floating gate to hold data. In addition, data is rewritten by compulsory flow of charge in a thin oxide film in contact with the floating gate. Therefore, the degradation of the film cannot be ignored. Further, there is a limitation on the number of writings and the lifetime is short. In addition, it has been impossible to concurrently perform writing operation and reading operation (for example, see Patent Document 1).

In addition, the cost of a semiconductor memory device generally depends on the size of the semiconductor memory device. Development for achieving high integration and reducing cost has been conducted by reducing an area occupied by a semiconductor element or a driving circuit in a semiconductor memory device. As a technique for miniaturizing a semiconductor element, a technique relating to a next-generation semiconductor referred to as a three-dimensional semiconductor has also been developed.

In view of high integration of a semiconductor memory device, attention has been drawn to development of a multi-valued memory technique. In a multi-valued memory in which data having any one of values more than two values (one bit) is stored in one memory cell, storage capacitance can be greatly increased as compared to a binary memory. However, in order to detect $2^n$ storage states in a multi-valued memory, threshold voltages of the group of memory cells need to be set to $2^n-1$ levels or more, and in addition, a plurality of detection cycles on the basis of the respective different threshold levels are also needed. For now, a multi-valued memory of eight values (3 bits) or more is not practically used.

REFERENCE

Patent Document

[Patent Document 1] Japanese Published Patent Application No. S57-105889

SUMMARY OF THE INVENTION

In a NOR type semiconductor memory device, writing operation is performed on word lines in sequence (in a row direction). Potentials of memory cells on one word line at the time of writing operation are determined in bit lines in sequence (in a column direction). The potentials of the memory cells on one word line at the time reading operation are also decided in the bit lines in sequence (in a column direction). At the time of writing operation, until the potentials of all of the memory cells on one word line are determined, writing operation of a next word line cannot start, and thus the potentials need to be kept. As described above, in a NOR type semiconductor memory device, the potentials of the memory cells on one word line cannot be determined concurrently, which is one factor of hindering high speed wiring operation.

Further, a NOR type semiconductor memory device has a structure in which memory cells are connected in parallel with their respective bit lines. A multi-valued NOR type semiconductor memory device in which threshold voltages are set at multiple levels has a problem of difficulty in high integration because a complicated control circuit is also needed.

In order to achieve high reliability of a multi-valued NOR type semiconductor memory device, correct decision at a desired potential is extremely important. In addition, in order to reduce power consumption, precise control of the amount of charge accumulated in a charge accumulation portion (a floating node) is needed. Consequently, appropriate control of a threshold voltage window width, highly precise writing operation, and highly precise reading operation are needed, but it is extremely difficult to achieve them.

In view of the above problems, an object of one embodiment of the disclosed invention is to provide a semiconductor memory device which is capable of shortening a time needed for holding desired charges in all memory cells on one word line by determining the potentials of the memory cells on the word line concurrently. Further, an object of one embodiment of the disclosed invention is to provide a semiconductor memory device whose power consumption is reduced and whose reliability is improved by improving an integration degree and achieving highly precise writing operation and highly precise reading operation. Further, an object of one embodiment of the disclosed invention is to provide a semiconductor memory device having a novel feature, in which a transistor including an oxide semiconductor (a transistor having high holding characteristics and favorable switching characteristics) is provided.

One embodiment of the disclosed invention is a semiconductor memory device including a plurality of memory cells each including a first transistor, a second transistor, and a capacitor; a bit line selection circuit; a word line selection circuit; a first bit line electrically connected to one of a source and a drain of the first transistor; a second bit line electrically connected to one of a source and a drain of the second transistor; a node where a first terminal of the capacitor, the other of the source and the drain of the first transistor, and a gate of the source and the drain of the second transistor are connected to each other; a first word line electrically connected to a gate of the first transistor; a second word line electrically connected to a second terminal of the capacitor; a plurality of third transistors; a potential control circuit supplying an output voltage that changes stepwise to one of a source and a drain of each of the plurality of third transistors, and stopping the supply of the output voltage when a writing voltage is determined in each of the other of the source and the drain of the plurality of third transistors; a reading circuit comparing a reference voltage with a voltage of the second bit line to output a reading signal; and a comparative decision circuit supplying a voltage that brings the plurality of third transistors into conduction to gate of each of the plurality of third transistors until the writing voltage is read out correctly, and supplying, after the writing voltage is read out correctly, a voltage that brings the plurality of third transistors out of conduction to the gate of each of the plurality of third transistors.

One embodiment of the present invention is the semiconductor memory device in which the semiconductor layer of the first transistor includes an oxide semiconductor material.

One embodiment of the present invention is the semiconductor memory device in which the semiconductor layer of the third transistor includes an oxide semiconductor material.

One embodiment of the present invention is the semiconductor memory device in which the oxide semiconductor material may include In, Ga, and Zn.

One embodiment of the present invention is a method for driving a semiconductor memory device. The semiconductor memory device including a plurality of memory cells each including a first transistor, a second transistor, and a capacitor; a first bit line electrically connected to one of a source and a drain of the first transistor; a second bit line electrically connected to one of a source and a drain of the second transistor; a first word line electrically connected to a gate of the first transistor; a second word line electrically connected to a terminal of the capacitor; a potential control circuit; a plurality of reading circuits; a plurality of comparative determination circuits; a plurality of third transistors having switching characteristics; a bit line selection circuit; and a word line selection circuit. The potential control circuit concurrently supplies output voltages which change stepwise to one of a source and a drain of each of the plurality of third transistors, and stops the supply of the output voltages when a writing voltage is determined in each of the other of the source and the drain of each of the plurality of third transistors. The plurality of reading circuits each compare a reference voltage with a voltage of the second bit line to output a reading signal. The plurality of comparative decision circuits each continue to supply a voltage which brings the plurality of third transistors into conduction to a gate of each of the plurality of third transistors until the writing voltage is read out correctly, and, after the writing voltage is read out correctly, supply a voltage which brings the plurality of third transistors out of conduction to the gate of each of the plurality of third transistor to determine a potential of the first bit line. The plurality of third transistors having switching characteristics each keep the voltage of the first bit line.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Further, in this specification, when "A is orthogonal to B (in a matrix)", A and B may intersect at right angles; alternatively, A and B may intersect physically at different angles, which can be expressed in the simplest circuit diagram as intersection at right angles. When "A is parallel to B (in a matrix)", the two wirings may be provided so as to physically intersect, which can be expressed in the simplest circuit diagram as parallel.

According to one embodiment of the disclosed invention, by concurrently determining the potentials of the memory cells on one word line, the semiconductor memory device in which a time needed for holding the desired charges in all of the memory cells on the one word line can be shortened can be obtained. In addition, the integration degree is improved and high-precision writing operation and high-precision reading operation can be achieved, whereby power consumption can be reduced and the semiconductor memory device with improved reliability can be obtained. In addition, the semiconductor memory device having a novel feature provided with a transistor including an oxide semiconductor can be obtained.

DETAILED DESCRIPTION OF THE INVENTION

Hereinafter, an embodiment of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiment.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Embodiment 1

In this embodiment, a circuit configuration and a method for driving a semiconductor memory device according to one embodiment of the disclosed invention will be described with reference to FIG. 1, FIG. 2, FIGS. 3A and 3B, and FIGS. 4A and 4B. Note that the method for driving the semiconductor memory device according to one embodiment of the disclosed invention allows concurrent determination of potentials of memory cells on one word line.

First, an example of a circuit configuration of a semiconductor memory device according to one embodiment of the disclosed invention is described with reference to FIG. 1. Note that in FIG. 1, all components of the semiconductor memory device are not illustrated, and a device which cannot be illustrated, a complicated peripheral circuit, and the like are omitted.

Figure 1:
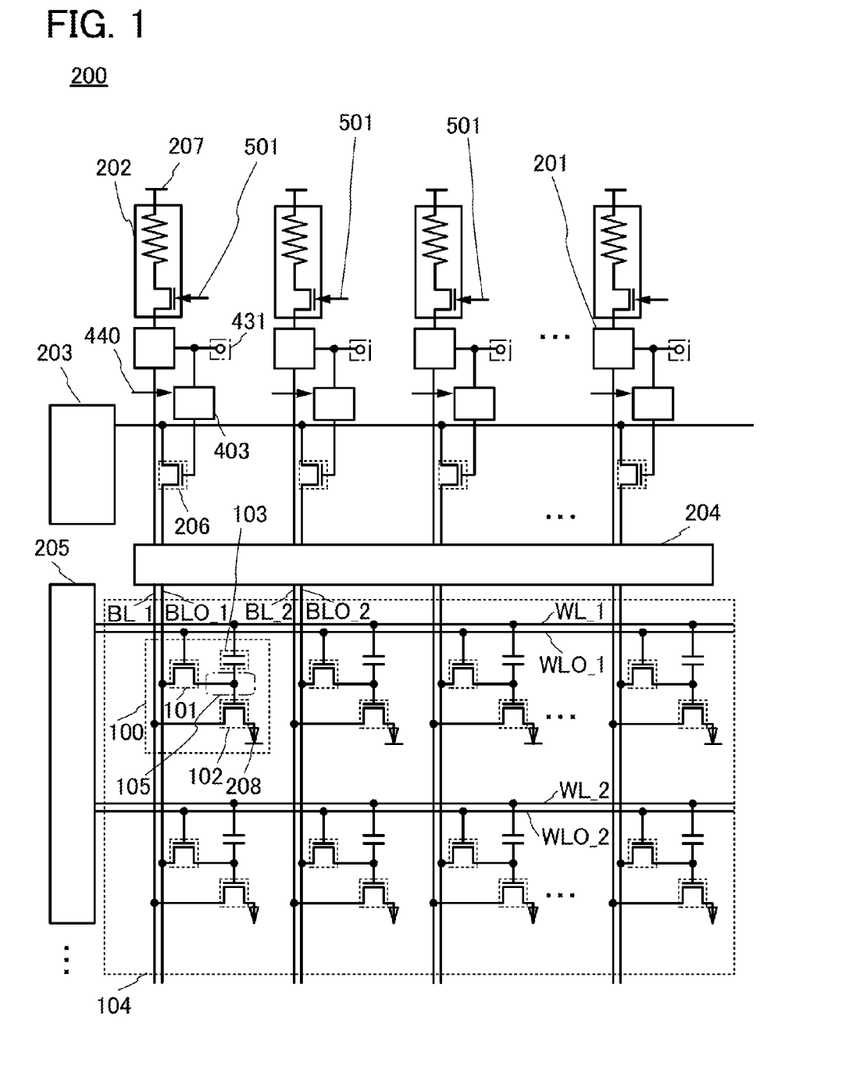
FIG. 1 is a circuit diagram of a semiconductor memory device.

A semiconductor memory device 200 illustrated in FIG. 1 includes a plurality of reading circuits 201, a plurality of control circuits 202, a potential control circuit 203, a plurality of comparative decision circuits 403, a bit line selection circuit 204, a word line selection circuit 205, a plurality of transistors 206, a plurality of word lines WLO, a plurality of word lines WL, a plurality of bit lines BLO, a plurality of bit lines BL, and a memory cell array 104 in which a plurality of memory cells 100 are arranged in a matrix. The memory cell 100 includes a transistor 101, a transistor 102, a capacitor 103, and a floating node 105.

A first terminal serving as one of a source terminal and a drain terminal of the transistor 206 is electrically connected to the potential control circuit 203. A second terminal serving as the other of the source terminal and the drain terminal of the transistor 206 is electrically connected to the bit line selection circuit 204. A gate terminal of the transistor 206 is electrically connected to an output terminal of the comparative decision circuit 403. One terminal of the control circuit 202 and the bit line BL are electrically connected to an input terminal of the reading circuit 201. An output terminal of the reading circuit 201 is electrically connected to an input terminal of the comparative decision circuit 403. The bit line selection circuit 204 is electrically connected to the bit line BLO and the bit line BL. The word line selection circuit 205 is electrically connected to the word line WLO and the word line WL. The other terminal of the control circuit 202 is electrically connected to a high voltage source terminal 207.

A first terminal serving as one of a source terminal and a drain terminal of the transistor 101 is electrically connected to the bit line BLO. A second terminal serving as the other of the source terminal and the drain terminal of the transistor 101 is electrically connected to one terminal of the capacitor 103 and a gate terminal of the transistor 102. A gate terminal of the transistor 101 is electrically connected to the word line WLO. A first terminal serving as one of a source terminal and a drain terminal of the transistor 102 is electrically connected to the bit line BL. A second terminal serving as the other of the source terminal and the drain terminal of the transistor 206 is electrically connected to a low voltage source terminal 208. The other terminal of the capacitor 103 is electrically connected to the word line WL.

An oxide semiconductor material is preferably used for the semiconductor layer of the transistor 101. As the oxide semiconductor material, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide a Sn—Ga—Zn-based oxide, an Al—Ga—Zn-based oxide, or a Sn—Al—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn, and there is no limitation on the composition ratio of In, Ga, and Zn. Besides In, Ga, and Zn, another metal element may be contained in the In—Ga—Zn-based oxide.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on desired semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

Next, as one example of the method for driving the semiconductor memory device according to one embodiment of the disclosed invention, a driving method in the case of a binary semiconductor memory device is described.

A high power supply potential Vdd is supplied to the high voltage source terminal 207, a ground potential Vgnd is supplied to the low voltage source terminal 208, and a reference potential Vref is supplied to the input terminal of the reading circuit 201. In that case, the reference potential Vref is a half of the high power supply potential Vdd, and the relation of the high power supply potential Vdd>the reference potential Vref>the ground potential Vgnd is satisfied.

An example of writing operation is described. First, potentials of all of the word lines WL and potentials of all of the bit lines BL are set to the ground potential Vgnd. All of the transistors 102 in the memory cells 100 are brought out of conduction.

Next, the potentials of the word lines WLO in rows where writing is performed are set to a potential Vw, and the potentials of the word lines WLO in rows where writing is not performed are set to the ground potential Vgnd. The transistors 101 in the memory cells 100 in the rows where writing is performed are brought into conduction, and the transistors 101 in the memory cells 100 in the rows where writing is not performed are brought out of conduction. Next, the potentials of the bit lines BLO are changed gradually. When the potentials of the bit lines BL in columns where writing is performed become the same as the reference potential, the transistors 206 in columns where writing is performed are turned off. At this time, a potential of a bit line BLO in a column where writing is performed is a potential Va and a potential of a floating node 105 in a column where writing is performed is also set to the potential Va. The transistors 206 in columns where writing is not performed are in off-state, and thus, the potentials of the floating nodes 105 in columns where writing is not performed are the ground potential Vgnd. At this time, the potential Va of the bit lines BLO in the columns where writing is performed and the ground potential Vgnd of the bit lines BLO where writing is not performed are determined concurrently. The value of potential Va depends on the characteristic of each memory cell.

Note that it is possible to control the amount of the charge accumulated in the floating node 105 by adjusting the potential Va. When a difference between the potential Va and the ground potential Vgnd is large, a threshold voltage window width can be expanded; when the difference between the potential Va and the ground potential Vgnd is small, the threshold voltage window width can be narrowed. Note that the threshold voltage window width refers to a difference between a threshold voltage which is determined by the original characteristics of the transistor 102, and a threshold voltage which is determined by the amount of the charge accumulated in the floating node 105. The potential Va is determined while a potential Vramp supplied to the first terminal serving as one of the source terminal and the drain terminal of the transistor 101 is being changed (raised or decreased) stepwise, whereby the potential Va can be controlled more precisely.

Next, the potentials of the word lines WLO in the rows where writing is performed are set to the ground potential Vgnd, and then the potentials of all of the bit lines BLO are set to the ground potential Vgnd. The transistors 101 in all of the memory cells 100 are brought out of conduction. Therefore, the charges accumulated in the floating nodes 105 are kept in the floating nodes 105.

Note that the transistors 101, which are transistors including an oxide semiconductor, have small off-state current. Thus, the charges accumulated in the floating nodes 105 are held for a long time.

An example of reading operation is described. First, the potentials of all of the word lines WL are set to a potential Vb, in order that the transistors 102 in all of the memory cells 100 are brought out of conduction without fault. Note that the potential Vb is set to a potential at which the transistors 102 are brought out of conduction either in the state where charges are accumulated in the floating nodes 105 or in the state where no charge is accumulated in the floating nodes 105. Thus, the potential Vb is preferably lower than at least the ground potential Vgnd.

Next, the potentials of all of the bit lines BL are set to a potential Vc. At this time, the potential Vc is in a floating state in all of the bit lines BL. The potentials of the word lines WL in rows where reading is performed are set to the ground potential Vgnd, and the potentials of the word lines WL in rows where reading is not performed are kept at the potential Vb.

When the transistors 102 connected to the bit lines BL are brought into conduction, the potentials of the bit lines BL in columns where reading is performed are changed from the potential Vc to the ground potential Vgnd. When the transistors 102 connected to the bit lines BL are brought out of conduction, the potentials of the bit lines BL in the columns where reading is performed are kept at the potential Vc. At this time, the potentials of the bit lines BL are decided concurrently. By the change in the potential, written data can be decided. For example, decision can be made such that the state where the transistor 102 is in a conduction state is read out as "1" and the state where the transistor 102 is in a non-conduction state is read out as "0".

According to the structure of the semiconductor memory device, concurrent determination of the potentials of the bit lines BLO can be performed at the same time as concurrent decision of the potentials of the bit lines BLO. In other words, the potentials of the memory cells on one word line can be determined concurrently and can be decided concurrently.

According to the structure of the semiconductor memory device, the potential Vramp is changed stepwise; the comparative decision circuit 403 continuously checks whether data resulted from reading is correct or not with respect to the written data; the raise (or the decrease) of the potential Vramp is repeated until the data is read correctly, and when the data is read correctly, the raise (or the decrease) of the potential Vramp is stopped. In other words, since writing operation and reading operation can be performed concurrently, it is possible to check whether characteristics capable of reading data in accordance with the written data can be obtained or not. For example, even when data which should be read as "1" is misidentified as "0", that misidentification can be found at that moment. Accordingly, as a result of reading, the data can be read out exactly as written. In this manner, concurrently performing writing operation and reading operation leads to an improvement in reliability as well as a reduction in operation time.

Figure 2:
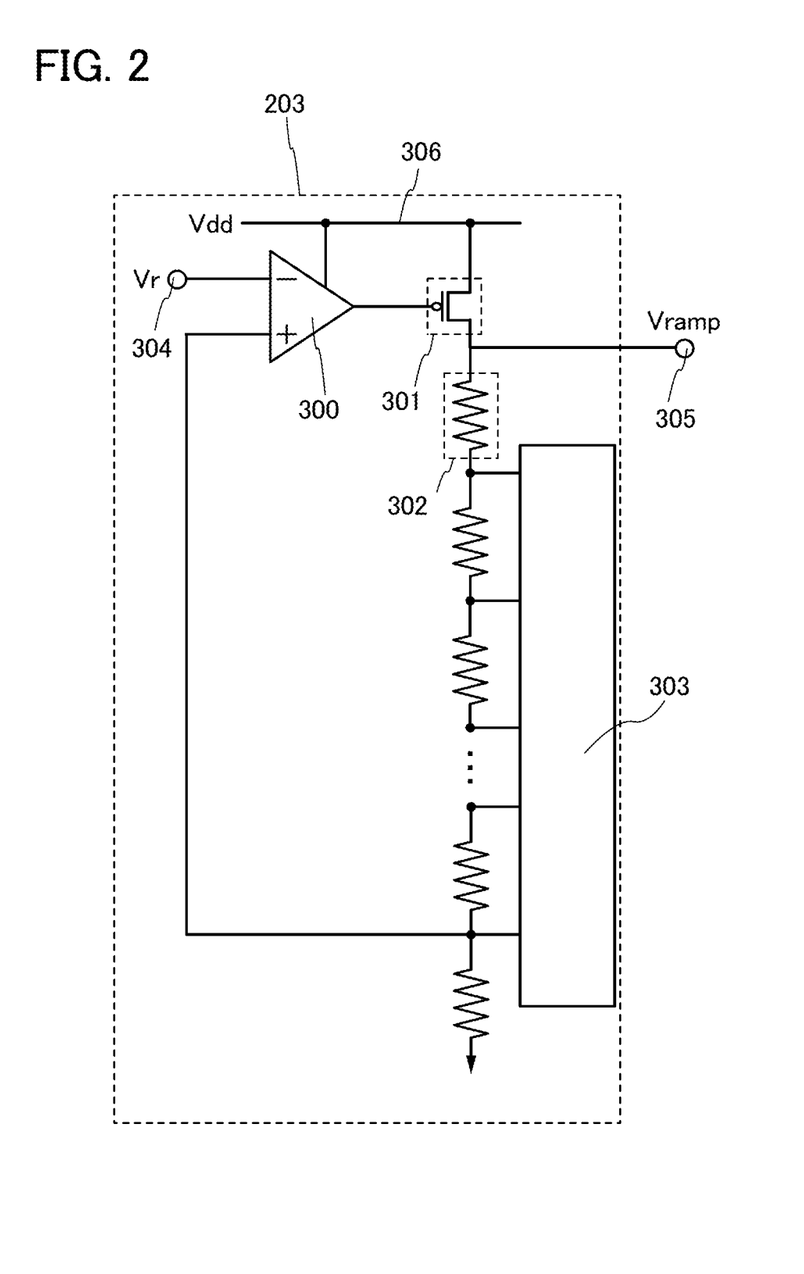
FIG. 2 is a circuit diagram of a semiconductor memory device.

Next, the potential control circuit 203 is described with reference to FIG. 2. The potential control circuit 203 includes a comparator 300, a transistor 301, a plurality of resistors 302, a controller 303, a terminal 304, a terminal 305, and a high voltage source terminal 306. The terminal 304, the terminal 305, and the high voltage source terminal 306 are set to a potential Vr, the potential Vramp, and the potential Vdd, respectively.

The potential control circuit 203 continues to change (raise or decrease) the potential Vramp stepwise, and has a function of supplying the potential Vramp while changing the potential Vramp and a function of stopping the supply of the potential Vramp. In order to change the potential Vramp stepwise, the resistors 302 connected to each other in series are used and resistance division is performed. Following the stepwise change in the resistance, stepwise change in the potential Vramp is possible. Note that there is no particular limitation on the configuration of the potential control circuit 203 as long as a function which is the same as the above-described function can be obtained. The potential control circuit is also referred to as a ramp voltage generation circuit.

Figure 3A:
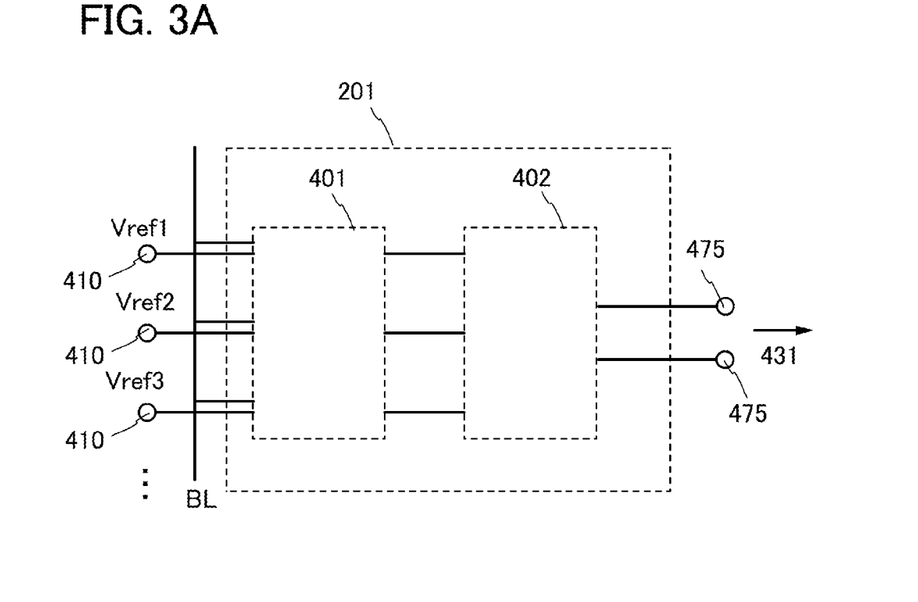
FIGS. 3A and 3B are circuit diagrams of a semiconductor memory device.
Figure 3B:
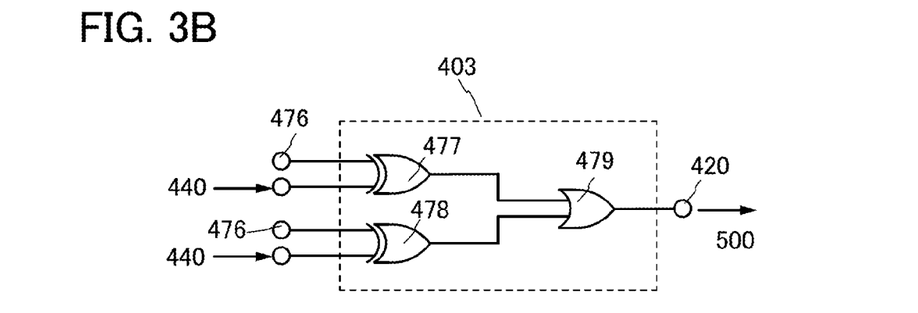
Figure 4A:
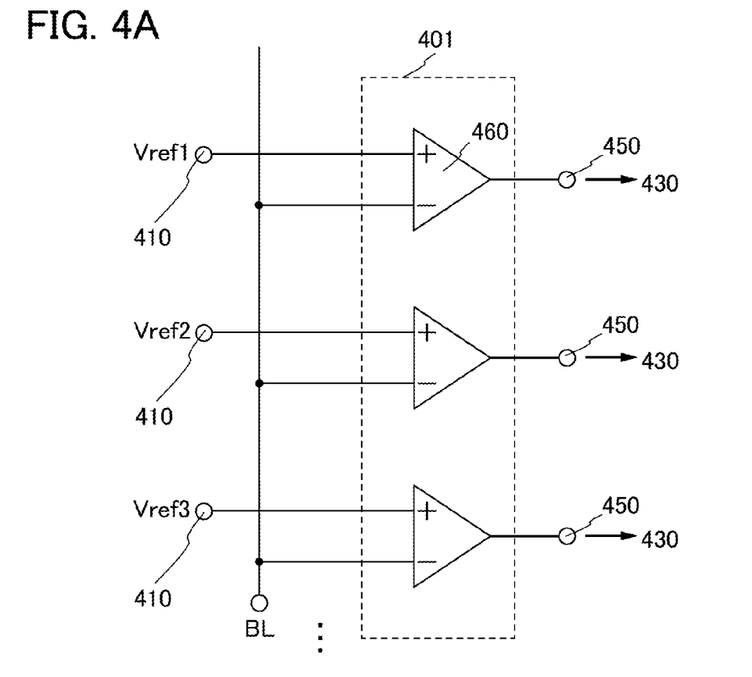
FIGS. 4A and 4B are circuit diagrams of a semiconductor memory device.
Figure 4B:
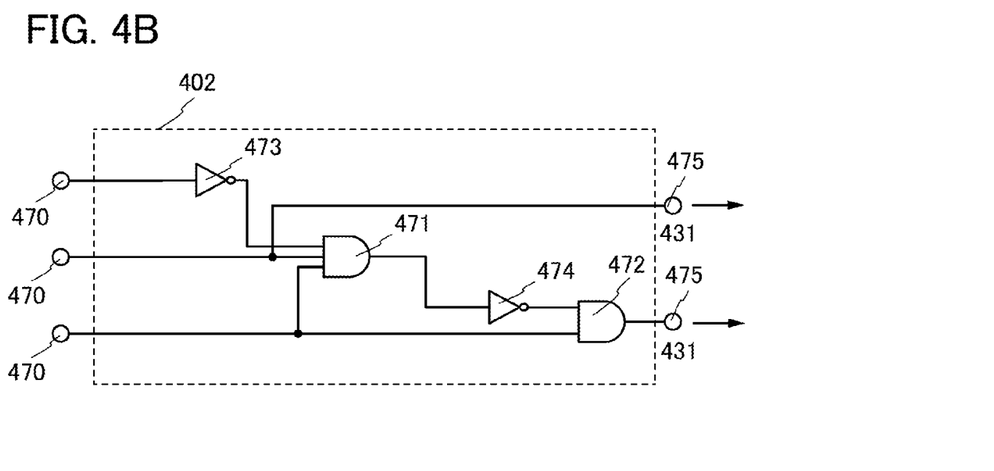

Next, the reading circuit 201 and the comparative decision circuit 403 are described with reference to FIGS. 3A and 3B and FIGS. 4A and 4B. FIG. 3A illustrates the whole of the reading circuit 201 and FIG. 3B illustrates the comparative decision circuit 403. FIGS. 4A and 4B illustrate details of a comparative circuit 401 and a logic converter circuit 402 which are included in the reading circuit 201.

The reading circuit 201 includes input terminals 410, output terminals 475, the comparative circuit 401, and the logic converter circuit 402. Note that the logic converter circuit 402 is needed in a multi-valued semiconductor memory device of four values or more. Since this embodiment describes the case of the binary semiconductor memory device, the logic converter circuit 402 is not needed.

The comparative circuit 401 includes the input terminal 410, a comparator 460, and an output terminal 450. Note that the number of the comparators 460 is the number of values stored in one memory cell. Thus, for example, one comparator is provided in the case of a binary semiconductor device, three comparators are provided in the case of a four-valued semiconductor device, and ($2^n-1$) comparators are provided in the case of a multi-valued semiconductor device. This is because the threshold value of one memory cell needs to be set to ($2^n-1$) levels or more. Since this embodiment describes the case of the binary semiconductor memory device, one comparator is provided.

The logic converter circuit 402 includes an AND gate 471, an AND gate 472, an inverter 473, an inverter 474, input terminals 470, and the output terminals 475.

The comparative decision circuit 403 includes an EXOR gate 477, an EXOR gate 478, an OR gate 479, input terminals 476, and an output terminal 420.

The comparative circuit 401 compares the potential of the bit line BL with the reference potential Vref, and outputs the obtained result as data 430 from the output terminals 450 to the logic converter circuit 402. The logic converter circuit 402 converts the data 430 obtained from the comparative circuit 401 so that all of the data 430 can be decided only as "0" and "1", and The logic converter circuit 402 outputs the data 430 as data 431 from the output terminals 475.

The comparative decision circuit 403 decides whether the data 431 obtained from the reading circuit 201 is correct or not with the use of latch data 440. When the data resulted from reading is correct with respect to the written data, data 500 which brings the transistor 206 out of conduction is output from the output terminal 420. When the data resulted from reading is incorrect with respect to the written data, data 500 which brings the transistor 206 into conduction is output from the output terminal 420. Whether the data 431 is correct or not is checked continuously and the potential continues to be supplied to the bit line BL until the data is read correctly; and when the data is read correctly, data which stops the supply of the potential is output. The function of the comparative decision circuit 403 enables writing operation and reading operation to be performed concurrently.

The control circuit 202 continuously detects the state of the NOR type semiconductor memory device, and has a function of bringing the NOR type semiconductor memory device into a desired state by using state detection data 501. By algorithm included in the control circuit 202, the control circuit 202 defines the entire state, and detects and controls the state. For example, a voltage is supplied to the bit line BL while reading is performed or writing is performed and the voltage is not supplied to the bit line BL during the quiescent mode of operation.

Note that there are no particular limitations on the configurations of the comparative circuit 401, the logic converter circuit 402, the comparative decision circuit 403, and the control circuit 202 as long as functions which are the same as the above-described functions can be obtained.

The semiconductor memory device 200 includes the transistors 206 having switching characteristics. The first terminals each serving as one of the source terminal and the drain terminal of the transistor 206 included in the semiconductor memory device 200 are connected to one potential control circuit 203 while the second terminals each serving as the other of the source terminal and the drain terminal of the transistor 206 are electrically connected to their respective bit lines BLO.

When the data resulted from reading is incorrect with respect to the written data, the comparative decision circuit 403 decides that the potential Vramp does not reach the desired potential, and the data 500 output from the output terminal 420 keeps the transistor 206 in a conduction state. In contrast, when the data resulted from reading is correct with respect to the written data, the comparative decision circuit 403 decides that the potential Vramp reaches the desired potential, and the data 500 output from the output terminal 420 brings the transistor 206 out of conduction. Note that the potential control circuit 203 continues to supply the potential which changes stepwise to the first terminal serving as one of the source terminal and the drain terminal of each of the transistors 206 until the moment when the potentials of the bit lines BLO of all of the memory cells on one word line reach the desired potential. In addition, at the moment when the potentials of the bit lines BLO of all of the memory cells on one word line reach the desire potential and all of the transistors 206 are brought out of conduction, the potential control circuit 203 stops the supply of the potential to the first terminal serving as one of the source terminal and the drain terminal of each of the transistors 206. At this time, the first terminals each serving as one of the source terminal and the drain terminal of the transistor 206 are connected to one potential control circuit 203, and thus, the potentials can be supplied concurrently and the supply of the potentials can be stopped concurrently. After this moment, the second terminals each serving as the other of the source terminal and the drain terminal of the transistor 206 are kept at the desired potential.

In other words, the potentials can be concurrently supplied to the first terminals each serving as one of the source terminal and the drain terminal of the transistor 206; the supply thereto can be stopped concurrently; and the potentials of the bit lines BLO can be determined only by the conduction or non-conduction of the respective transistors 206 included in the bit lines BLO. Consequently, the potentials of the memory cells on one word line can be determined concurrently. Further, since reading operation and writing operation can be performed concurrently, the potentials of the memory cells on one word line can be decided concurrently.

In addition, time for keeping the determined potential can be largely reduced. In the semiconductor memory device 200, the time for keeping the determined potential is, at most, a time needed for change in the potential Vramp from the lowest (highest) potential to the highest (lowest) potential. In the conventional semiconductor memory device, the determined potential should be kept until the potentials of all of the memory cells on one word line are determined, and thus, there is a considerable difference in the time for keeping the determined potential between the semiconductor memory device according to one embodiment of the present invention and the conventional one.

Note that when a transistor including an oxide semiconductor is used as the transistor 206, off-state current can be small and favorable switching characteristics can be obtained. Further, a transistor including an oxide semiconductor has extremely high holding characteristics, the potential kept in the second terminal serving as the other of the source terminal and the drain terminal of the transistor 206 has extremely high reliability.

By adopting the semiconductor memory device, it is possible to concurrently determine the potentials of the memory cells on one word line. In addition, since reading operation and writing operation can be performed concurrently, it is also possible to concurrently decide the potentials of the memory cells on one word line. It is possible to continuously check whether data resulted from reading with respect to written data is correct or not and to determine a desired potential while the potential is being changed (raised or decreased) stepwise. Thus, high-precision writing operation and high-precision reading operation can be achieved. Further, by precise control of the potential, supply of the potential or stop of the supply can be performed with highest operation efficiency in the semiconductor memory device, and thus, power consumption can be reduced and the reliability can be improved.

Figure 5A:
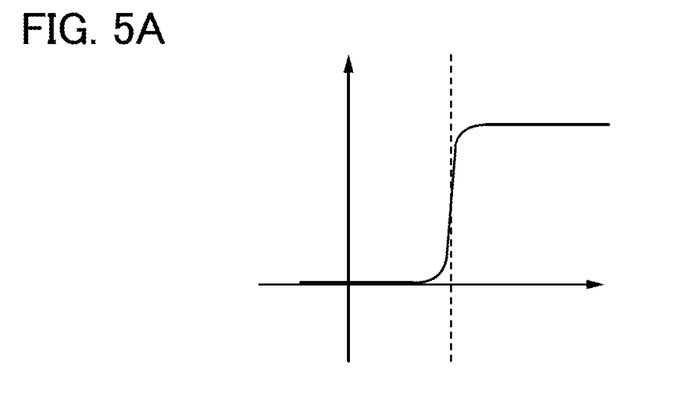
FIGS. 5A to 5C are graphs showing characteristics of transistors included in a semiconductor memory device.

Next, the threshold voltage window width and variation in threshold voltages are described with reference to FIGS. 5A to 5C and FIGS. 6A to 6C. In FIGS. 5A to 5C and FIGS. 6A to 6C, the vertical axis represents a current value and the horizontal axis represents a voltage value. Generally, a semiconductor memory device includes an enormous number of transistors 102. The transistors 102 have different threshold voltages and there is variation in the threshold voltages. Therefore, in consideration of the variation in the threshold voltages, a potential in the vicinity of the limit potential of the gate terminal, at which conduction and non-conduction of are switched in each of the transistors 102 and operation efficiency is favorable needs to be supplied or stopped in the semiconductor memory device. FIG. 5A is a schematic diagram showing an ideal state where there is no variation in the threshold voltages of all of the transistors 102. With such a state, it is easy to determine potentials at which switching between the conduction and non-conduction of the transistors is performed.

Figure 5B:
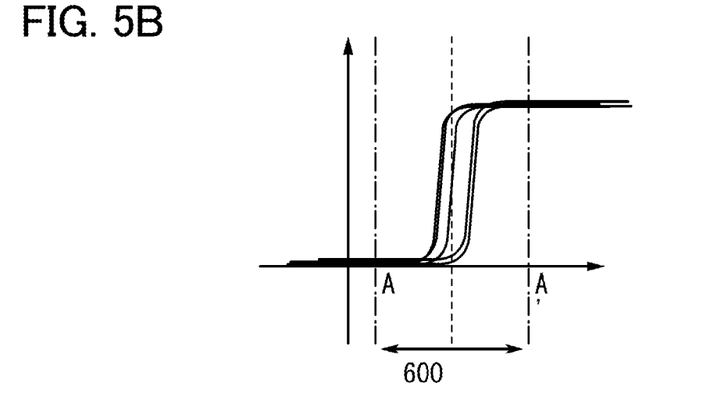
Figure 5C:
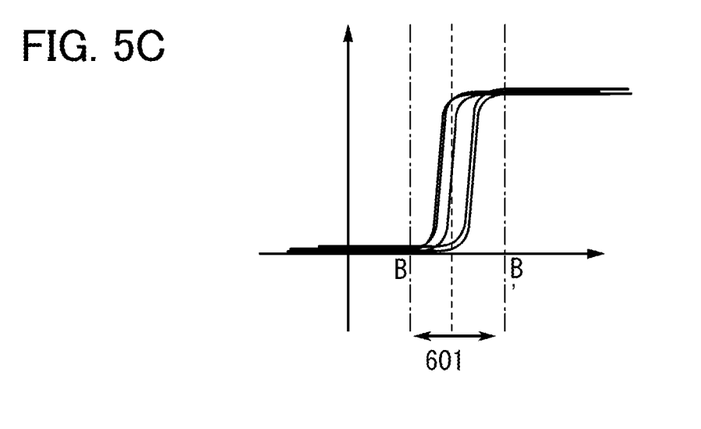

However, actually, there is variation in the threshold voltages as shown in FIGS. 5B and 5C. Therefore, it is difficult to determine the potentials at which switching between conduction and non-conduction of the transistors. Note that FIG. 5B shows the case where decision of data in the binary memory device is performed with a width 600, and FIG. 5C shows the case where decision of data in the binary memory device is performed with a width 601.

In the case where whether data resulted from reading is correct or not with respect to written data is decided at the potentials of A and A' shown in FIG. 5B, correct data can be obtained without fault. However, even in the case where whether data resulted from reading is correct or not with respect to written data is decided at the potentials of B and B' shown in FIG. 5C, correct data can also be obtained without fault.

The width 600 is larger than the width 601. In other words, in the case where whether data resulted from reading is correct or not with respect to written data is decided at the potentials of A and A', a large potential is supplied to the semiconductor memory device as compared to the case where whether data resulted from reading is correct or not with respect to written data is decided at the potentials of B and B'.

It is desirable to perform decision of correct and incorrect at the potentials (the potentials of B and B') that are limits of the gate terminal, at which switching between the conduction and non-conduction of the transistors 102 is performed. The potentials are potentials with highest operation efficiency in which power consumption can be reduced without a reduction of reliability.

Next, the threshold voltage window width is described with reference to FIGS. 6A to 6C. Note that FIG. 6B shows the case where decision of data in a four-valued memory device is performed with the width 600 shown in FIG. 5B, and FIG. 6C shows the case where decision of data in the four-valued memory device is performed with the width 601 shown in FIG. 5C.

Figure 6A:
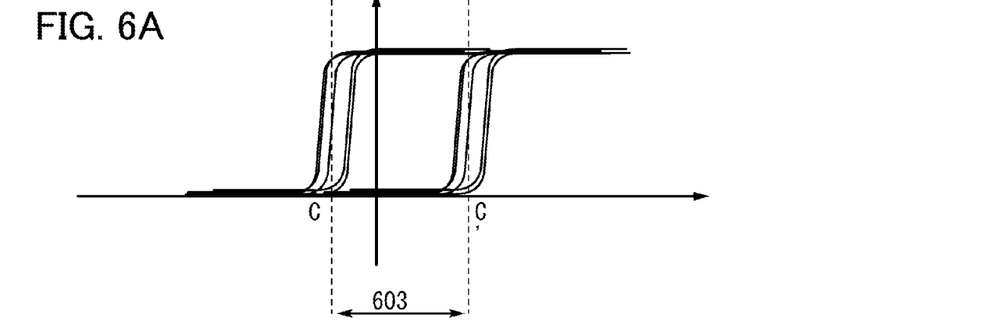
FIGS. 6A to 6C are graphs showing characteristics of transistors included in a semiconductor memory device.

As shown in FIG. 6A, the threshold voltage window width refers to a difference 603 between a threshold voltage C' which is determined by the original characteristics of the transistor and a threshold voltage C which is determined by the amount of a charge accumulated in the charge accumulated portion (the floating node 105). Note that the amount of the charge accumulated in the floating node 105 can be controlled by the potential of the bit line BL. The threshold window width needs a certain width. In particular, when the threshold voltage window width is too small in the semiconductor memory device having many variations in the threshold voltages, an overlap of the variations is caused and correct decision of data is not performed. The threshold voltage window width at the potential where correct decision is performed without fault is a width 606 shown in FIG. 6B, and the threshold voltage window width at the potential in the vicinity of the limit of the gate terminal, at which correct decision is performed without fault, is a width 607 shown in FIG. 6C.

Figure 6B:
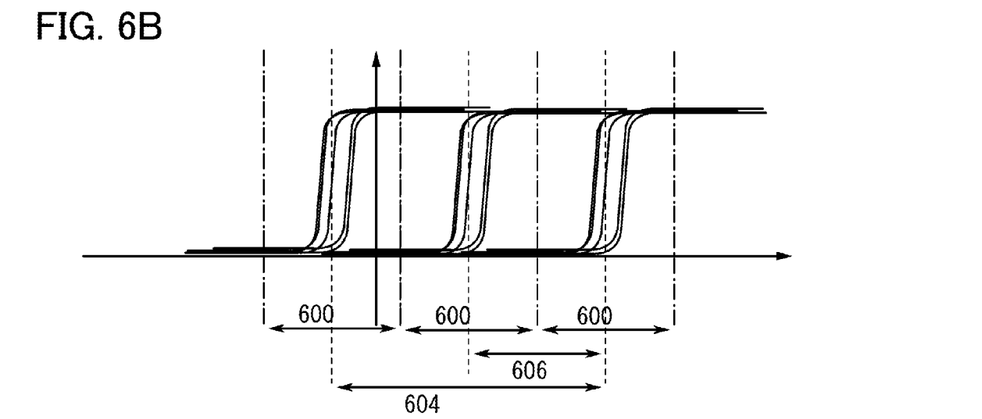
Figure 6C:
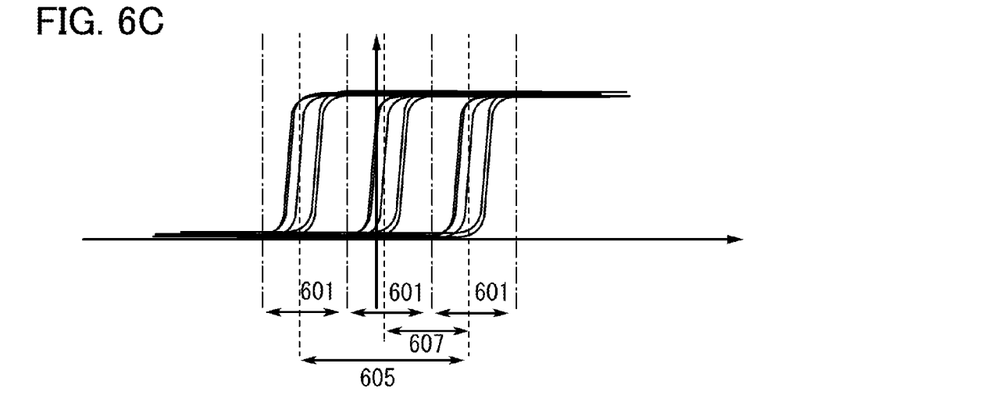

As shown in FIG. 6B, in the case where decision of data is performed with the width 600 shown in FIG. 5B, the total threshold voltage window width is a width 604. As shown in FIG. 6C, in the case where decision of data is performed with the width 601 shown in FIG. 5C, the total threshold voltage window width is a width 605. The width 604 is larger than the width 605. In other words, in FIG. 6B, a large potential is supplied to the semiconductor memory in the decision of data as compared to the case of FIG. 6C. That is, in the case of a multi-valued semiconductor memory device in which threshold voltages are set at multiple levels, it is important to make decision of correct and incorrect at the potential of the limit of the gate terminal, at which switching between the conduction and non-conduction of the transistors 102 is performed.

In the semiconductor memory device according to one embodiment of the present invention, it is possible to perform decision of data at the potentials of the limit of the gate terminal, at which switching between conduction and non-conduction of the transistors 102 is performed, in consideration of variation in the threshold voltages that are characteristics of all of the transistors 102 mounted on the semiconductor memory device. Accordingly, high-precision writing operation and high-precision reading operation can be performed without supplying an extra potential to the semiconductor memory device. Thus, power consumption can be reduced and the semiconductor memory device with improved reliability can be achieved.

In addition, even in the case of the multi-valued semiconductor memory device in which the threshold voltages are set at multiple levels, variation in the threshold voltages can be recognized correctly. That is, with respect to the threshold voltages of the multiple levels, correct decision at the desired voltage can be performed while threshold voltage window width is minimalized. Accordingly, a complicated control circuit is not required and thus, high integration of the semiconductor memory device can be achieved.

By concurrently determining the potentials of the memory cells on one word line, the semiconductor memory device in which a time needed for holding the desired charges in all of the memory cells on the one word line can be shortened can be obtained. In addition, the integration degree is improved and high-precision writing operation and high-precision reading operation can be achieved, whereby power consumption can be reduced and the semiconductor memory device with improved reliability can be obtained. In addition, the semiconductor memory device having a novel feature provided with a transistor including an oxide semiconductor can be obtained.

This application is based on Japanese Patent Application serial No. 2010-281631 filed with Japan Patent Office on Dec. 17, 2010, the entire contents of which are hereby incorporated by reference.

What is claimed is:

1. A semiconductor device comprising:
- a first memory cell comprising:
  - a first transistor;
  - a second transistor; and
  - a first capacitor;
- a second memory cell comprising:
  - a third transistor;
  - a fourth transistor; and
  - a second capacitor;
- a first word line;
- a second word line;
- a first bit line;
- a second bit line;
- a third bit line;
- a fourth bit line;
- a ramp voltage generator circuit;
- a fifth transistor; and
- a sixth transistor,
- wherein one of a source and a drain of the first transistor is electrically connected to a gate of the second transistor,
- wherein the other of the source and the drain of the first transistor is electrically connected to the first bit line,
- wherein a gate of the first transistor is electrically connected to the first word line,
- wherein one of a source and a drain of the second transistor is applied to a first voltage,
- wherein the other of the source and the drain of the second transistor is electrically connected to the second bit line,
- wherein a gate of the second transistor is electrically connected to a first electrode of the first capacitor,
- wherein a second electrode of the first capacitor is electrically connected to the second word line,
- wherein one of a source and a drain of the third transistor is electrically connected to a gate of the fourth transistor,
- wherein the other of the source and the drain of the third transistor is electrically connected to the third bit line,
- wherein a gate of the third transistor is electrically connected to the first word line,
- wherein one of a source and a drain of the fourth transistor is applied to the first voltage,
- wherein the other of the source and the drain of the fourth transistor is electrically connected to the fourth bit line,
- wherein a gate of the fourth transistor is electrically connected to a first electrode of the second capacitor,
- wherein a second electrode of the second capacitor is electrically connected to the second word line,
- wherein one of a source and a drain of the fifth transistor is electrically connected to the first bit line,
- wherein the other of the source and the drain of the fifth transistor is electrically connected to an output terminal of the ramp voltage generator circuit,
- wherein one of a source and a drain of the sixth transistor is electrically connected to the third bit line, and
- wherein the other of the source and the drain of the sixth transistor is electrically connected to the output terminal of the ramp voltage generator circuit.

2. The semiconductor device according to claim 1, wherein the first transistor comprises a semiconductor layer comprising an oxide semiconductor material.

3. The semiconductor device according to claim 2, wherein the oxide semiconductor material comprising In, Ga, and Zn.

4. The semiconductor device according to claim 1, wherein the third transistor comprises a semiconductor layer comprising an oxide semiconductor material.

5. The semiconductor device according to claim 4, wherein the oxide semiconductor material comprising In, Ga, and Zn.

6. A semiconductor device comprising:
- a plurality of memory cells each comprising a first transistor, a second transistor, and a capacitor;
- a bit line selection circuit;
- a word line selection circuit;
- a first bit line electrically connected to one of a source and a drain of the first transistor;
- a second bit line electrically connected to one of a source and a drain of the second transistor;
- a node where a first terminal of the capacitor, the other of the source and the drain of the first transistor, and the other of the source and the drain of the second transistor are connected to each other;
- a first word line electrically connected to a gate of the first transistor;
- a second word line electrically connected to the first terminal of the capacitor;
- a plurality of third transistors;
- a potential control circuit supplying an output voltage that changes stepwise to one of a source and a drain of each of the plurality of third transistors, and stopping the supply of the output voltage when a writing voltage is determined in each of the other of the source and the drain of each of the plurality of third transistors;
- a reading circuit comparing a reference voltage with a voltage of the second bit line to output a reading signal; and
- a comparative decision circuit supplying a voltage that brings the plurality of third transistors into conduction to gate of each of the plurality of third transistors until the writing voltage is read out correctly, and supplying, after the writing voltage is read out correctly, a voltage that brings the plurality of third transistors out of conduction to the gate of each of the plurality of third transistors.

7. The semiconductor device according to claim 6, wherein the first transistor comprises a semiconductor layer comprising an oxide semiconductor material.

8. The semiconductor device according to claim 7, wherein the oxide semiconductor material comprises In, Ga, and Zn.

9. The semiconductor device according to claim 6, wherein each of the plurality of third transistors comprises a semiconductor layer comprising an oxide semiconductor material.

10. The semiconductor device according to claim 9, wherein the oxide semiconductor material comprises In, Ga, and Zn.

* * * * *